United States Patent
Huang (10) Patent No.: US 11,262,424 B2
(45) Date of Patent: Mar. 1, 2022

(54) METHOD AND APPARATUS FOR HARDWARE RF RECEIVER CHANNEL REDUCTION

(71) Applicant: KONINKLIJKE PHILIPS N.V., Eindhoven (NL)

(72) Inventor: Luwei Huang, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 1010 days.

(21) Appl. No.: 15/503,115

(22) PCT Filed: Aug. 14, 2015

(86) PCT No.: PCT/EP2015/068804
§ 371 (c)(1),
(2) Date: Feb. 10, 2017

(87) PCT Pub. No.: WO2016/024024
PCT Pub. Date: Feb. 18, 2016

(65) Prior Publication Data
US 2017/0234948 A1    Aug. 17, 2017

(30) Foreign Application Priority Data

Aug. 14, 2014  (WO) ............... PCT/CN2014/084407
Nov. 10, 2014  (EP) .................................. 14192427

(51) Int. Cl.
*G01R 33/36*    (2006.01)
*G01R 33/561*   (2006.01)
*G01R 33/3415*  (2006.01)

(52) U.S. Cl.
CPC ..... *G01R 33/3621* (2013.01); *G01R 33/3415* (2013.01); *G01R 33/5612* (2013.01); *G01R 33/3664* (2013.01)

(58) Field of Classification Search
CPC ............ G01R 33/3415; G01R 33/3621; G01R 33/3664; G01R 33/5612; G01R 33/36
See application file for complete search history.

(56) References Cited

U.S. PATENT DOCUMENTS

| | | |
|---|---|---|
| 8,085,046 B2 | 12/2011 | Zelinski et al. |
| 2003/0132750 A1 | 7/2003 | Machida et al. |
| 2007/0013375 A1 | 1/2007 | Akao et al. |
| 2009/0230966 A1* | 9/2009 | Ehnholm ........... G01R 33/3415 324/322 |
| 2010/0013472 A1 | 1/2010 | Buehrer et al. |
| 2010/0289494 A1 | 11/2010 | Wald et al. |
| 2011/0074420 A1* | 3/2011 | Ladebeck ........ G01R 33/34046 324/318 |
| 2013/0044960 A1 | 2/2013 | Zhang et al. |
| 2014/0070804 A1 | 3/2014 | Huang et al. |

* cited by examiner

Primary Examiner — Rishi R Patel

(57) ABSTRACT

Method and apparatus for hardware coil compression is disclosed. The coils in an array configured for the same region of interest are grouped into sub-arrays. The coils of each sub-array are pre-combined with a hardware combiner before further processing. The pre-combination converter composed of the pre-combiners is flexible, i.e., applicable to for example non-cylindrical coils; simpler than direct implementation of the software compression algorithm; and commercially feasible.

13 Claims, 4 Drawing Sheets

Converter with pre-combiners, splitters and combiners which convert receiver channels into virtual receiver channels

Converter with splitters and combiners
which converts receiver channels into virtual receiver channels

FIG. 1

Converter with pre-combiners, splitters and combiners
which convert receiver channels into virtual receiver channels

FIG. 2

Degraded converter with pre-combiners
which combines receiver channels into combined receiver channels

METHOD AND APPARATUS FOR HARDWARE RF RECEIVER CHANNEL REDUCTION

CROSS REFERENCE TO RELATED APPLICATIONS

This application is a U.S. national phase application of International Application No. PCT/EP2015/068804, filed on Aug. 14, 2015, which claims the benefit of PCT/CN2014/084407 filed Aug. 14, 2014 and EP 14192427.4 filed Nov. 10, 2014 and is incorporated herein by reference.

FIELD OF THE INVENTION

The present invention involves coil compression for Magnetic Resonance Imaging (MRI), and specifically a method and apparatus for coil compression using a hardware coil compressor.

BACKGROUND OF THE INVENTION

Magnetic Resonance Imaging (MRI), Nuclear Magnetic Resonance Imaging (NMRI), or Magnetic Resonance Tomography (MRT) is a medical imaging technique used in radiology to investigate the anatomy and function of the body in both health and disease. MRI is based on the principles of nuclear magnetic resonance (NMR), a spectroscopic technique used by scientists to obtain microscopic chemical and physical information about molecules. MRI scanners use strong magnetic fields and radiowave to produce high quality images of the inside of the human body.

MRI scanners have evolved considerably since the first commercial units were introduced in the 1980s. An MRI system is composed of a main magnet, gradient coils, a Radio Frequency (RF) coil, and a computer system. The main magnet produces a strong magnetic field $B_0$ around the area to be imaged. Gradient coils produce a gradient in $B_0$ in the X, Y, and Z directions. The RF coil produces the $B_1$ magnetic field necessary to rotate the spins by 90°, 180°, or any other value selected by the pulse sequence. The RF coil also detects the signal from the spins within the body. The computer system, or imaging computer, receives the detected RF signals and reconstructs the images of the inside of the human body.

An MRI system using receiver arrays with many RF coil elements provides images with high Signal-to-Noise Ratio (SNR), parallel imaging acceleration, or both of them. The growing number of RF coil elements results in growing number of receiver channels or signal channels, growing amount of data and computation in the reconstruction. A commercial imaging computer, however, has usually up to limited 4 inputs each for one channel, due to complexity and cost considerations. This implies that the number of signal channels, which may be for example 32, has to be reduced, or compressed, to 4 before the signals can be input into a commercial imaging computer.

Techniques for coil compression, receiver channel reduction or MRI data compression may be used to compress data from many channels into fewer virtual channels. For example, a typical 16 coil element system providing 16 receiver channels or signal channels may be linearly combined using 16 sets of combination coefficients to produce 16 virtual channels. The 16 sets of combination coefficients constitute a conversion matrix. If the conversion matrix is well chosen, the 16 virtual channels contain all information contained in the original 16 receiver channels, and the virtual channel with the highest SNR may be the virtual channel with theoretically obtainable highest SNR. The 4 virtual channels with the highest SNRs may be input into a 4 channel imaging computer for image reconstruction.

Coil compression may be realized with a software compressor, a hardware compressor, or a compressor implemented with both hardware and software. Hardware compressors provide fast compression. Software compressors provide flexibility. Hardware compressors and software compressors may be selected or adequately combined for feasibility, imaging quality, cost effectiveness, simplicity, etc.

Hardware compressors include Butler Matrix (King S, Varosi S, Duensing G., Optimum SNR data compression in hardware using an eigencoil array. MagnReson Med 2010; 63:1346-1356), TIM ("Mode Matrix—A Generalized Signal Combiner for Parallel Imaging Arrays", ISMRM 2004 (1587)) and direct implementation of software compression ("A generalized analog mode-mixing matrix for channel compression in receive arrays", ISMRM 2009 (101)). However, the Butler Matrix and the TIM are only applicable to specific coil configurations. The Butler matrix is only applicable to a cylindrical array of coils and it is inefficient for linear arrays or normal surface coil arrays. The TIM is only applicable to a linear array of coils such as a spine and torso coil array and the compression ratio is limited to 3:1. The direct implementation of software compression is too complex. A 32:8 conversion matrix directly implementing the software coil compression with hardware is not restricted to the configuration of the coil array and is not limited to the compression ratio of 3:1, but the compressor hardware is constructed with too many hardware components and is thus too complex and cost-inefficient for commercial products.

US20100289494A1 from Wald et al. discloses a hardware-based compression including a mode-mixing apparatus. The mode-mixing apparatus includes a plurality of splitters, a plurality of combiners and a plurality of pathways to compress acquired multi-channel MR signals to produce compressed multi-channel MR signals. The hardware-based compression can be utilized with a variety of array coils. A publication "Array compression for MRI with large coil arrays" in Magnetic Resonance in Medicine, 1 Jun. 2007, discloses an array compression using optimized combination relative to principal component analysis (PCA) method which results in relative homogeneous virtual sensitivities. Another publication "a software channel compression technique for faster reconstruction with many channels" in Magnetic Resonance in Medicine, 1 Jan. 2008, introduces a PCA based method from channel compression which requires no calculation of sensitivity maps, noise correlation or any other prior information. US2007013375A1 from Akao et al. discloses a method and apparatus which reduces the number of channels employed in the parallel reconstruction from the M channel signals to a lower number of channel signals. The optimal choice of reconstructed channel modes can be mode using prior view information and/or sensitivity data for the given slice.

With the number of coils growing, a compression technique is needed which provides high quality imaging and is simple and cost effective.

SUMMARY OF THE INVENTION

Method and apparatus for hardware coil compression is disclosed. The coils in an array configured for the same Region of Interest (ROI) are grouped into sub-arrays. The coils of each sub-array are pre-combined with a hardware combiner before further compression. The pre-combination converter composed of the pre-combiners is flexible, i.e., applicable to for example non-cylindrical coils; simpler than direct implementation of the software compression algorithm; and commercially feasible.

For example, for pre-combination, a conversion matrix M is constructed first for the coils in the array configured for the same ROI. The conversion matrix M is optimized for the conversion outputs to have highest qualities. The coils are ordered and grouped into sub-arrays based on their importance. The pre-combination coefficients are determined for the sub-space spanned by the pre-combination coefficients to be as close as possible to the space spanned by all rows or the most important rows of the optimized conversion matrix M for the ordered coils. The converter constructed with hardware pre-combiners is simple and cost effective for commercial implementation and is of high performance.

As one example, a method of hardware coil compression for Magnetic Resonance Imaging (MRI) comprises: pre-combining, using a plurality of hardware pre-combiners, outputs from coils of sub-arrays to obtain pre-combination outputs, one pre-combiner for each of the sub-arrays, wherein the sub-arrays are obtained by grouping coils of an array which is configured for imaging a Region of Interest (ROI).

As one example, in the method of hardware coil compression for MRI, the coils in the array are grouped into the sub-arrays based on importance of each of the coils.

As one example, in the method of hardware coil compression for MRI, the importance of a coil is represented by the contribution of the output of the coil to the Signal-to-Noise Ratio (SNR) of the signal obtained by combining the outputs of the coils.

As one example, in the method of hardware coil compression for MRI, the coils are grouped into the sub-arrays by: assigning coils with the highest importance into the sub-arrays, one coil for each sub-array; and repeating the assignment of the remaining coils until all coils are assigned.

As one example, in the method of hardware coil compression for MRI, the sub-arrays and pre-combination coefficients for the sub-arrays are determined by: constructing a channel conversion matrix M of n×n which converts signals $s=(s_1, s_2, \ldots, s_n)^T$ output from the coils of the array to conversion outputs $s'=(s_1', s_2', \ldots, s_n')^T$, $s'=Ms$, wherein $T$ represents matrix transpose operation; selecting rows of the channel conversion matrix M corresponding to a number of conversion outputs with the highest Signal-to-Noise Ratios (SNRs); and optimizing the pre-combination coefficients or both the grouping and the pre-combination coefficients such that the pre-combination coefficients span a space which approaches the space spanned by all or the selected rows of M.

As one example, in the method of hardware coil compression for MRI, the channel conversion matrix is an optimal channel conversion matrix.

As one example, in the method of hardware coil compression for MRI, the pre-combination outputs are further linearly combined to obtain virtual outputs.

As one example, an apparatus of coil compression for Magnetic Resonance Imaging (MRI) comprises: a plurality of hardware pre-combiners, each of the plurality of hardware pre-combiners is configured to combine outputs from coils in one of a plurality of sub-arrays, wherein the sub-arrays are obtained by grouping coils of an array which is configured for imaging a Region of Interest (ROI).

As one example, in the apparatus of hardware coil compression for MRI, the coils in the array are grouped into the sub-arrays based on importance of each of the coils.

As one example, in the apparatus of hardware coil compression for MRI, the importance of a coil is represented by the contribution of the output of the coil to the Signal-to-Noise Ratio (SNR) of the signal obtained by combining the outputs of the coils.

As one example, in the apparatus of hardware coil compression for MRI, the coils are grouped into sub-arrays by: assigning coils with the highest importance into the sub-arrays, one coil for each sub-array; and repeating the assignment of the remaining coils until all coils are assigned.

As one example, in the apparatus of hardware coil compression for MRI, the sub-arrays and pre-combination coefficients for the sub-arrays are determined by: constructing a channel conversion matrix M of n×n which converts signals $s=(s_1, s_2, \ldots, s_n)^T$ output from the coils of the array to conversion outputs $s'=(s_1', s_2', \ldots, s_n')^T$, $s'=Ms$, wherein $T$ represents matrix transpose operation; selecting rows of the channel conversion matrix M corresponding to a number of conversion outputs with the highest Signal-to-Noise Ratios (SNRs); and optimizing the pre-combination coefficients or both the grouping and the pre-combination coefficients such that the pre-combination coefficients span a space which approaches the space spanned by all or the selected rows of M.

As one example, in the apparatus of hardware coil compression for MRI, the channel conversion matrix is an optimal channel conversion matrix.

As one example, in the apparatus of hardware coil compression for MRI, the pre-combination outputs are further linearly combined to obtain virtual outputs.

BRIEF DESCRIPTION OF THE DRAWINGS

Features and advantages of the embodiments of the invention will become apparent from the following detailed description in which.

DETAILED DESCRIPTION OF EMBODIMENTS

Various aspects of the novel systems, apparatus and methods are described more fully hereinafter with reference to the figures. The teachings disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the novel systems, apparatus, and methods disclosed herein, whether implemented independently of or combined with any other aspect of the invention. For example, an apparatus may be implemented or a method may be practiced using any number of the aspects set forth herein. In addition, the scope of the invention is intended to cover such an apparatus or method which is practiced using other structure, functionality, or structure and functionality in addition to or other than the various aspects of the invention set forth herein. It should be understood that any aspect disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different technologies, system configurations, some of which are illustrated by way of example in the figures and in the following description of the preferred aspects. The detailed description and drawings are merely illustrative of the disclosure rather than limiting, the scope of the disclosure being defined by the appended claims and equivalents thereof.

In a MRI system, many coils may be placed around a Region of Interest (ROI) to improve imaging quality. The image of the inside of the ROI may be obtained by combining a portion or all of the outputs of the coils for the optimum Signal to Noise Ratio (SNR). For example, an array of coils may be placed around the head of a human body, another array of coils may be placed around the arm of a human body, and a further array of coils may be placed around the leg of a human body. The arm, the head, and the leg are three ROIs, and the three arrays are placed for the reconstruction of the images of the three regions of the human body. The three arrays may provide parallel imaging acceleration with a factor of three. The outputs of the coils of each array may be input to an imaging computer and combined in the imaging computer to increase the SNR of the image. However, the number of inputs of a commercial imaging computer is limited to, for example, 4 channels. The number of coil elements in an array for a ROI may be large, for example, up to 64. It may have to be reduced or compressed to no more than 4 channels and coil compression may be necessary.

Figure 1:
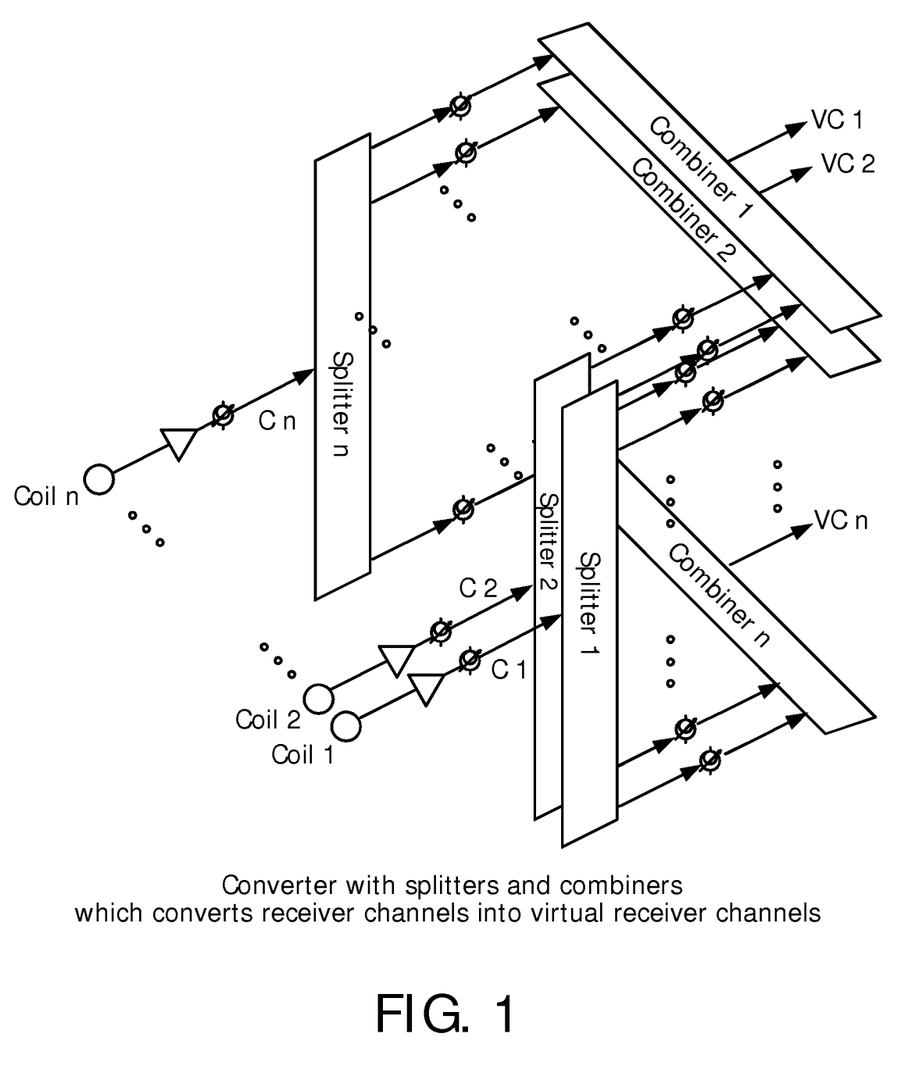
FIG. 1 illustrates a converter with splitters and combiners which converts receiver channels into virtual receiver channels.

Coil compression, or receiver channel reduction, MRI data compression may be used to compress data from many receiver channels for a ROI into fewer virtual receiver channels. FIG. 1 illustrates a converter with splitters and combiners which converts receiver channels into virtual receiver channels.

As illustrated in FIG. 1, n coils $c_1, c_2, \ldots, c_n$ are deployed for a ROI. Each of the n coils outputs a signal in the process of imaging and the n coils constitute n signal channels or receiver channels. The n signals may be amplified, digitized and input into a computer if, for example, the computer has n inputs. Imaging of the ROI may be completed in the computer. However, the growing number n may be large, such as up to 32, 64, 128, or even larger, while the number of the inputs of a commercial imaging computer may be limited to only 4 for cost reasons. Thus, signal combination, signal compression, channel compression, or coil compression may be inevitable, which selects the signals after combination with the highest qualities, such as highest SNRs.

As a general model for channel compression, FIG. 1 illustrates n splitters followed by n combiners. Each of the splitters provides n copies of the signal output from one of the n coils. The outputs from the n splitters may then be combined with a combiner to produce one combination output. There may be totally n combiners and n combination outputs. There may be up to n linearly independent combination outputs for n coils.

Each of the combiners may be characterized by a set of complex combination coefficients. The combination is actually the linear combination using the complex combination coefficients as weights. The amplitudes of the combination coefficients represent the amplitude weights, and the angles or the arguments of the combination coefficients represent the phase shifts added to the signal channels. Optimized linear combinations may produce combinations with highest signal qualities or highest signal SNRs. The splitters, the combiners, and the phase shifters and attenuators between the splitters and the combiners constitute a converter.

The converter illustrated in FIG. 1 may be implemented with software, hardware components, or a combination of both of them. The converter implemented with hardware components provides fast compression. The converter implemented with software components provides flexibility. Hardware components and software components may be selected or adequately combined for feasibility, imaging quality, cost effectiveness, simplicity, etc.

For hardware implementation, the output of each of the n coils illustrated in FIG. 1 and configured for the same ROI is pre-amplified with a Low Noise Amplifier (LNA) first, and the output of the LNA may be adjusted with a phase shifter and an attenuator and then connected to a hardware splitter. The hardware splitter splits the pre-amplified, phase shifted and amplitude attenuated signal into a number of copies. In the case that the splitters are hardware splitters, there may be splitting loss in addition to the simple copying. The split signals are then adjusted with a set of phase shifters and attenuators and combined using a hardware combiner into a virtual receiver channel. Different virtual receiver channels may be obtained with different sets of phase shifters and attenuators. The splitters, the combiners, and the phase shifters and attenuators between the splitters and the combiners constitute a converter. There may be up to n splitters, n×n phase shifters and attenuators and n combiners for linearly independent n combination outputs, in addition to the phase shifters and attenuators between the coils and the splitters.

For software implementation, the combiners illustrated in FIG. 1 represent weighted additions or linear combinations. The splitters illustrated in FIG. 1 represent the simple copy operation. The phase shifters and attenuators represent complex combination coefficients. A/D conversions are necessary before digital processing.

In general, the converter including n splitters, n×n phase shifters and attenuators, and n combiners may be expressed as a channel conversion matrix M of n×n which converts signals $s=(s_1, s_2, \ldots, s_n)^T$ output from the n coils of the array to conversion outputs $s'=(s_1', s_2', \ldots, s_n')^T$. The conversion may be expressed as the following equation:

$$s' = Ms \quad (1)$$

or $$\begin{pmatrix} s'_1 \\ s'_2 \\ \vdots \\ s'_n \end{pmatrix} = \begin{pmatrix} m_{11} & m_{12} & \cdots & m_{1n} \\ m_{21} & m_{22} & \cdots & m_{2n} \\ & & \ddots & \\ m_{n1} & m_{n2} & \cdots & m_{nn} \end{pmatrix} \begin{pmatrix} s_1 \\ s_2 \\ \vdots \\ s_n \end{pmatrix} \quad (2)$$

where $s_i$ is the signal output from the $i^{th}$ coil $c_i$; $i=1, 2, \ldots, n$; n is the number of coils for the same ROI; and $^T$ represents transpose operation.

Different converters or different conversion matrix M may result in different sets of conversion output s'. An optimum conversion matrix M may result in an optimum conversion output s'. For example, the conversion matrix M may be chosen or optimized to produce converted or conversion outputs $s_1', s_2', \ldots, s_n'$ with the highest signal qualities. More specifically, the conversion matrix M may be chosen or optimized to produce conversion outputs $s_1', s_2', \ldots, s_n'$ with the highest SNRs. With the conversion matrix M and the conversion outputs $s_1', s_2', \ldots, s_n'$ a portion of the n conversion outputs with the greatest qualities or greatest SNRs may be chosen for imaging in an imaging computer. For example, 4 of the n conversion outputs with the greatest SNRs may be chosen and input into a 4 channel imaging computer. For example, if the conversion outputs $s_1', s_2', \ldots, s_n'$ are ordered by quality from the highest to the lowest, $s_1', s_2', s_3', s_4'$ with the highest qualities may be chosen. Coil compression, receiver channel reduction or MRI data compression, signal compression, channel compression may be achieved by choosing only a portion of the n conversion outputs, for example m of the n conversion outputs. In practice, only the chosen conversion outputs are necessary to be input into the imaging computer for further processing. In that case, the number of combinations is m, and the number of phase shifters and attenuators immediately before the combination may be reduced from n×n to m×n, where m<n.

For example, a typical 16 coil element system providing 16 receiver channels or signal channels may be linearly combined using 16 sets of combination coefficients to produce 16 virtual channels. The 16 sets of combination coefficients constitute a conversion matrix M. If the conversion matrix is well chosen, the 16 virtual channels contain all information contained in the original 16 receiver channels, and the virtual channel with the highest SNR may be the virtual channel with theoretically obtainable highest SNR. The 4 virtual channels with the highest SNRs may be input into a 4 channel imaging computer for image reconstruction. In that case, the number of combinations is 4, and the number of phase shifters and attenuators immediately before the combination may be reduced from 16×16 to 4×16. However, the number of combinations and the number of phase shifters and attenuators are still too large for commercial implementation.

In the case that the conversion is implemented with software, the computation for combinations is a heavy load to the computer when n is large, and n Analog-to-Digital (A/D) converters have to be used after the pre-amplifications of the n channels and before the n data channels are processed digitally. In the case that the conversion is implemented with hardware, the computation for combinations is eliminated. Only m A/D converters have to be used after the channel compression and before the digital processing or before the compressed m data channels are input into the imaging computer. However, at least m×n phase shifters and attenuators are required, which is too large a number and difficult to be commercially implemented when n is large.

A lot of efforts have been made for the further compression of the receiver channels. For example, as mentioned above, a hardware coil compression method is based on the Butler matrix. However, it is applicable to only cylindrical coil arrays, making it inefficient for linear arrays or normal surface coil arrays. The TIM method is also developed, but it is applicable to only linear arrays such as spine and torso coil arrays, and its compression ratio is limited to no more than 3:1. Another method providing a 32:8 conversion matrix directly implements the software coil compression algorithm with hardware, and is not subject to the above mentioned 2 shortcomings. However, it requires a lot of compression hardware, making it inefficient for commercial implementation. A novel converter with pre-combination for channel compression may be used to solve the above problem which is illustrated in FIG. 2 and FIG. 3.

Figure 2:
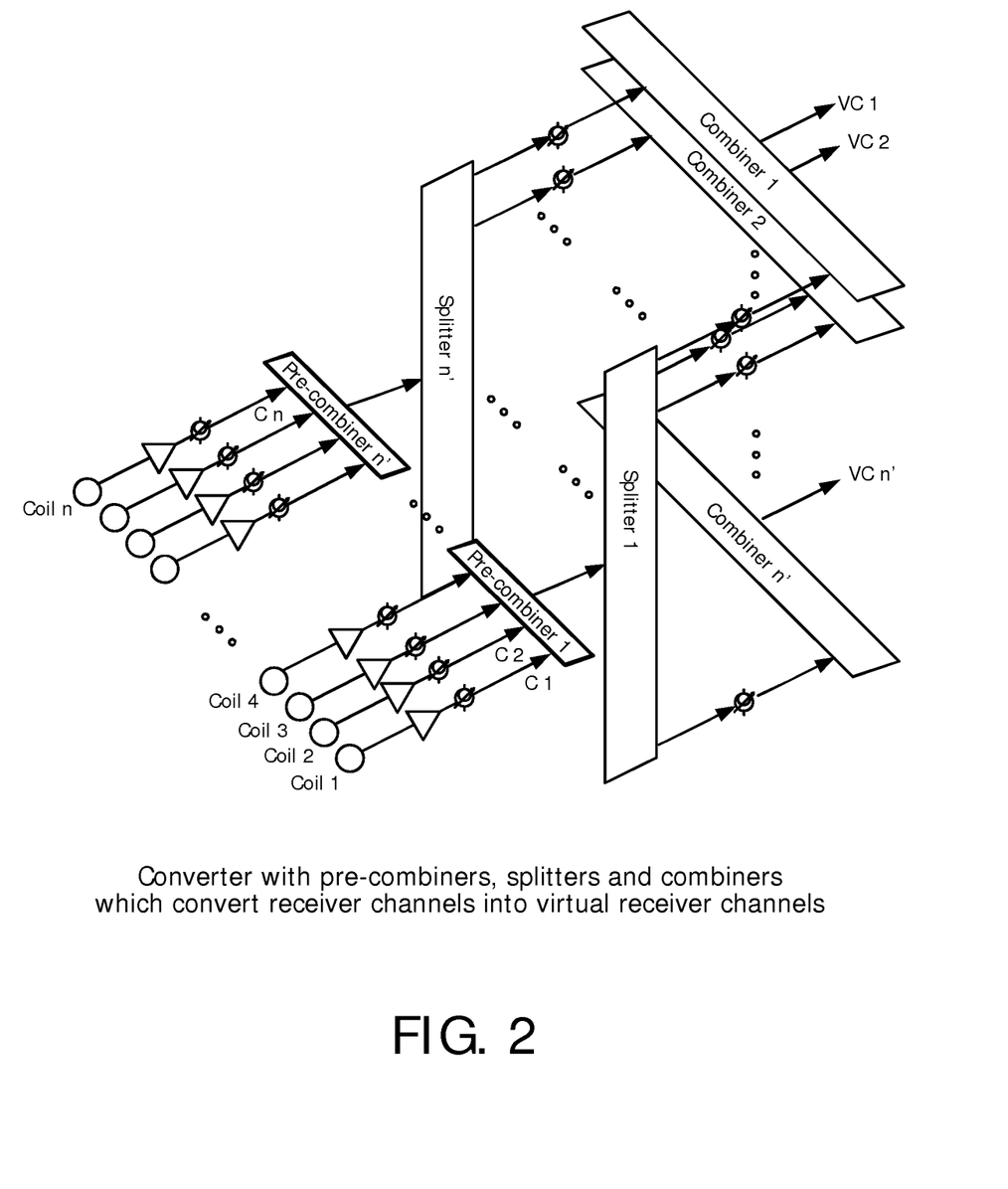
FIG. 2 illustrates a converter with pre-combiners, splitters and combiners which converts receiver channels into virtual receiver channels.
Figure 3:
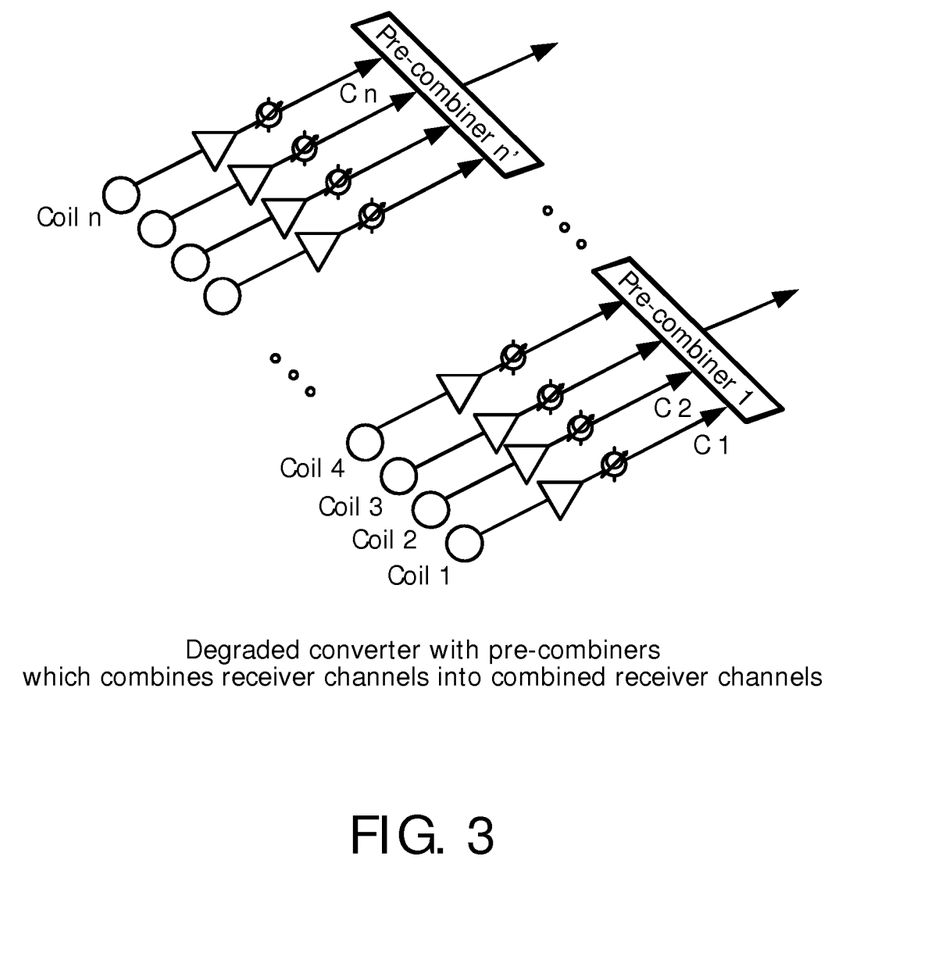
FIG. 3 illustrates a degraded converter with pre-combiners which combines receiver channels into combined receiver channels.

FIG. 2 illustrates a novel converter with pre-combination prior to channel compression of the converter in FIG. 1. FIG. 3 illustrates a degraded one. As illustrated in FIG. 2, a set of n coils $c_1, c_2, \ldots, c_n$ are configured for the same ROI. Though they are shown in FIG. 2 as a linear array, they may be deployed in any other way. The only restriction is that they are deployed for the same ROI. The n coils in the array are grouped into n' sub-arrays. For each sub-array, the outputs of all the coils in the sub-array are pre-combined with a pre-combiner and one pre-combination output is produced. In that way, the n channels are reduced or compressed into n' channels. The pre-combiners may be software combiners or hardware combiners. The converter constructed with hardware pre-combiners is simple and cost effective for commercial implementation.

Mathematically, a pre-combination matrix V of n'×n may be constructed which converts signals $s=(s_1, s_2, \ldots, s_n)^T$ output from the coils $c_1, c_2, \ldots, c_n$ of the array to pre-combination outputs $s''=(s_1'', s_2'', \ldots, s_{n'}'')^T$:

$$s'' = Vs \quad (3)$$

In each column of the pre-combination matrix V, only one element is nonzero.

$$V = \begin{pmatrix} v_{11} & \cdots & v_{1d_1} & 0 & \cdots & 0 & \cdots & 0 & \cdots & 0 \\ 0 & \cdots & 0 & v_{21} & \cdots & v_{2d_2} & \cdots & 0 & \cdots & 0 \\ \vdots & \vdots & \vdots & \vdots & \vdots & \vdots & \vdots & \vdots & \vdots & \vdots \\ 0 & \cdots & 0 & 0 & \cdots & 0 & \cdots & v_{n'1} & \cdots & v_{n'd_{n'}} \end{pmatrix} \quad (4)$$

The pre-combination matrix V shown above is only an example which indicates that sub-arrays are composed respectively of $d_1, d_1, \ldots, d_{n'}$ coils, where $d_1+d_1+\ldots+d_{n'}=n$, and the coils of each sub-array are coils adjacent in the array. In the case that the coils of a sub-array are not coils adjacent in the array, the pre-combination matrix V looks different from shown above, but may look similar to the pre-combination matrix V shown above after a linear transformation. The transformation is equivalent to renumbering the coils without changing the physical deployment.

For the purpose of producing the best image of the ROI, the grouping and pre-combination may be based on importance of each of the coils. The importance of each of the coils may be represented by the contribution of the output of the coil to the Signal-to-Noise Ratio (SNR) of the signal obtained by combining the coils.

The array of coils may be grouped into subgroups in many ways. For example, the coils may be grouped into sub-arrays by assigning coils with the highest importance into the sub-arrays, one coil for each sub-array, and repeating the assignment of the remaining coils until all coils are assigned.

More specifically, without loosing generality, coils $c_1$, $c_2$, ..., $c_n$ are assumed to be ordered from the most important to the least important. For example, coil $c_1$ is the most important, and $c_n$ is the least important. In that case, $c_1$ is assigned to sub-array 1, $c_2$ is assigned to sub-array 2, ..., $c_{n'}$ is assigned to sub-array n'. The remaining coils $c_{n'+1}$, $c_{n'+2}$, ..., $c_{2n'}$ are assigned respectively to sub-arrays 1, 2, ..., n' in the same way. That is, $c_{n'+1}$ is assigned to sub-array 1, $c_{n'+2}$ is assigned to sub-array 2, ..., $c_{2n'}$ is assigned to sub-array n'. The remaining coils $c_{2n'+1}$, $c_{2n'+2}$, ..., $c_n$ are assigned to sub-arrays 1, 2, ..., n' in the same way, again. The process is repeated, until all the coils are assigned to sub-arrays. There may be many other ways of grouping the coils in the array for the same ROI. For example, the most important k coils $c_1$, $c_2$, ..., $c_k$ are assigned to sub-array 1, the most important k coils $c_{k+1}$, $c_{k+2}$, ..., $c_{k+k}$ of the remaining n–k coils are assigned to sub-array 2, and so on. As an example, k=n\n'+1. "n\n'" represents the largest integer which is less than n/n'. The coils may also be grouped by assigning $c_1$ and $c_n$ to sub-array 1, assigning $c_2$ and $c_{n-1}$ to sub-array 2, and so on.

The sub-arrays and pre-combination coefficients for the sub-arrays may alternatively be determined by constructing a channel conversion matrix M of n×n which converts signals $s=(s_1, s_2, \ldots, s_n)^T$ output from the coils of the array to conversion outputs $s'=(s_1', s_2', \ldots, s_n')^T$, s'=Ms; selecting rows of the channel conversion matrix M corresponding to a number of conversion outputs with the highest SNRs; and optimizing the pre-combination coefficients or both the grouping and the pre-combination coefficients such that the pre-combination coefficients span a space which approaches the space spanned by the selected rows of M or all the rows of M. The space spanned by a matrix refers to a space obtained by linear combinations of row vectors or column vectors of the matrix. The conversion outputs $s_1', s_2', \ldots, s_m'$ with the greatest importance, for example, with the greatest SNRs, may be selected.

Another channel conversion matrix M' of n'×n' may be used to convert the pre-combination outputs $s''=(s_1'', s_2'', \ldots, s_{n'}'')^T$ to conversion outputs $s'''=(s_1''', s_2''', \ldots, s_{n'}''')^T$ as shown in FIG. 2:

$$s'''=M's''=M'Vs \quad (5)$$

The pre-combination matrix V may be such that the linear combination of the n' conversion outputs: $(a_1\ a_2\ \ldots\ a_{n'})s''= (a_1\ a_2\ \ldots\ a_{n'})Vs$ approaches the linear combination of the first n' conversion outputs $(b_1\ b_2\ \ldots\ B_{n'}\ 0\ \ldots\ 0)Ms$, or the space of 16-element row matrix $(a_1\ a_2\ \ldots\ a_{n'})V$ approaches the space of 16-element row matrix $(b_1\ b_2\ \ldots\ b_{n'}\ 0\ \ldots\ 0)M$ or the space of 16-element row matrix $(b_1\ b_2\ \ldots\ b_{n'}\ b_{n'+1}\ \ldots\ b_n)M$. Where $a_i$, i=1, ..., n' and $b_i$, i=1, n are arbitrary complex numbers.

The optimization may be expressed in more detail as follows:

$$(a_1\ a_2\ \ldots\ a_{n'})\begin{pmatrix} v_{11} & \ldots & v_{1d_1} & 0 & \ldots & 0 & \ldots & 0 & \ldots & 0 \\ 0 & \ldots & 0 & v_{21} & \ldots & v_{2d_2} & \ldots & 0 & \ldots & 0 \\ \vdots & \vdots & \vdots & \vdots & \vdots & \vdots & \vdots & \vdots & \vdots & \vdots \\ 0 & \ldots & 0 & 0 & \ldots & 0 & \ldots & v_{n'1} & \ldots & v_{n'd_{n'}} \end{pmatrix} =$$

$$(a_1 v_{11}\ \ldots\ a_1 v_{d_1 1}\ a_2 v_{21}\ \ldots\ a_2 v_{2d_2}\ \ldots\ a_{n'} v_{n'1}\ \ldots\ a_{n'} v_{n'd_{n'}})$$

approaches $$(b_1\ b_2\ \ldots\ b_{n'}\ 0\ \ldots\ 0)\begin{pmatrix} m_{11} & m_{12} & \ldots & m_{1n} \\ m_{21} & m_{22} & \ldots & m_{2n} \\ \vdots & \vdots & \vdots & \vdots \\ m_{n1} & m_{n2} & \ldots & m_{nn} \end{pmatrix} =$$

$$\left(\sum_{i=1,n'} b_i m_{i1}\ \sum_{i=1,n'} b_i m_{i2}\ \ldots\ \sum_{i=1,n'} b_i m_{in}\right),$$

or $$(b_1\ b_2\ \ldots\ b_{n'}\ b_{n'+1}\ \ldots\ B_n)\begin{pmatrix} m_{11} & m_{12} & \ldots & m_{1n} \\ m_{21} & m_{22} & \ldots & m_{2n} \\ \vdots & \vdots & \vdots & \vdots \\ m_{n1} & m_{n2} & \ldots & m_{nn} \end{pmatrix} =$$

$$\left(\sum_{i=1,n} b_i m_{i1}\ \sum_{i=1,n} b_i m_{i2}\ \ldots\ \sum_{i=1,n} b_i m_{in}\right)$$

The channel conversion matrix M may be selected to be a theoretically optimal channel conversion matrix. The software compression method may be used to obtain the theoretically optimal channel conversion matrix M. For example, the theoretically optimal channel conversion matrix M is a whitening matrix. Then array elements in the coil array may be grouped into sub-arrays based on the optimal channel conversion matrix M.

Taking a 16-element coil array as an example, a channel conversion matrix M of 16×16 may be constructed which converts signals $s=(s_1, s_2, \ldots, s_{16})^T$ output from the 16 coils $c_1, c_2, \ldots, c_{16}$ of the array to conversion outputs $s'=(s_1', s_2', \ldots, s_{16}')^T$. Its rows correspond to the new virtual channels. We have s'=Ms, and $M=(M^1_{1\times 16}, M^2_{1\times 16}, \ldots, M^{16}_{1\times 16})^T$, $M^i$ is the $i^{th}$ row of M, and the corresponding covariance matrix is $C_{16\times 16}$ of the signals $s'=(s_1', s_2', \ldots s_{16}')^T$ with its diagonal components as $C_1, C_2, \ldots C_{16}$, representing respectively the SNRs for the virtual channels. The matrix M is arranged such that the diagonal components of the covariance matrix are in a descending order. In that way, $C_1$ corresponds to the virtual channel which has the greatest SNR, while $C_{16}$ corresponds to the virtual channel which has the least SNR.

Using hardware to implement M directly, the four virtual channels with the greatest SNRs (say, $M^1$ through $M^4$, in the case of 16:4 compression) will be directly implemented with hardware, resulting in sixteen 1-to-4 power splitters, 4 16-to-1 power combiners, and 64 phase shifters and attenuators. The hardware converter is too complicated for commercial implementation.

Using the method of pre-combination, the 16 elements of the array are grouped into 4 sub-arrays, each having 4 elements. There are 16 input channels and 4 output channels for the pre-combination. For the grouping, the first 4 rows of M ($M^1$ through $M^4$), for example, are used to determine how the grouping should be implemented. An analysis is performed to figure out the most and least important coil array elements, and then the 16 coil elements are rated and ordered by their importance. The 16 elements are grouped into 4 sub-arrays based on the order of importance.

After the 16 coil elements are grouped into 4 sub-arrays, one 4-input-1-output RF hardware pre-combiner is used for each 4-element sub-array, so we have four pre-combination matrixes, say $v^1_{1\times 4}$, $v^2_{1\times 4}$, $v^3_{1\times 4}$, $v^4_{1\times 4}$, to be determined.

$$s'_1 = v^1(s_1, s_2, s_3, s_4)^T = (v^1_1, v^1_2, v^1_3, v^1_4)\begin{pmatrix} s_1 \\ s_2 \\ s_3 \\ s_4 \end{pmatrix},$$

$$s'_2 = v^2(s_5, s_6, s_7, s_8)^T = (v^2_1, v^2_2, v^2_3, v^2_4)\begin{pmatrix} s_5 \\ s_6 \\ s_7 \\ s_8 \end{pmatrix},$$

$$s'_3 = v^3(s_9, s_{10}, s_{11}, s_{12})^T = (v^3_1, v^3_2, v^3_3, v^3_4)\begin{pmatrix} s_9 \\ s_{10} \\ s_{11} \\ s_{12} \end{pmatrix},$$

$$s'_4 = v^4(s_{13}, s_{14}, s_{15}, s_{16})^T = (v^4_1, v^4_2, v^4_3, v^4_4)\begin{pmatrix} s_{13} \\ s_{14} \\ s_{15} \\ s_{16} \end{pmatrix}.$$

The four pre-combination matrixes $v^1$, $v^2$, $v^3$ and $v^4$ span a sub-space: $W_{result}=(a_1 v^1, a_2 v^2, a_3 v^3, a_4 v^4)$, in which $a_1$, $a_2$, $a_3$ and $a_4$ are arbitrary complex numbers. $W_{result}$ is a space of 16-element row matrix.

The target of choosing sub-array groups, as well as choosing the RF pre-combination matrixes $v^1$, $v^2$, $v^3$ and $v^4$, is to construct another space $W_{target}=b_1 M^1+b_2 M^2+b_3 M^3+b_4 M^4$, or $W_{target}=b_1 M^1+b_2 M^2+b_3 M^3+b_4 M^4+b_5 M^5+\ldots+b_{16}M^{16}$, and $W_{result}$ should be as close to the $W_{target}$ as possible, in which $b_1$, $b_2$, $b_3$, ..., $b_{16}$ are also arbitrary complex numbers, and $M^i$ is the $i^{th}$ row of M as indicated above.

Figure 4:
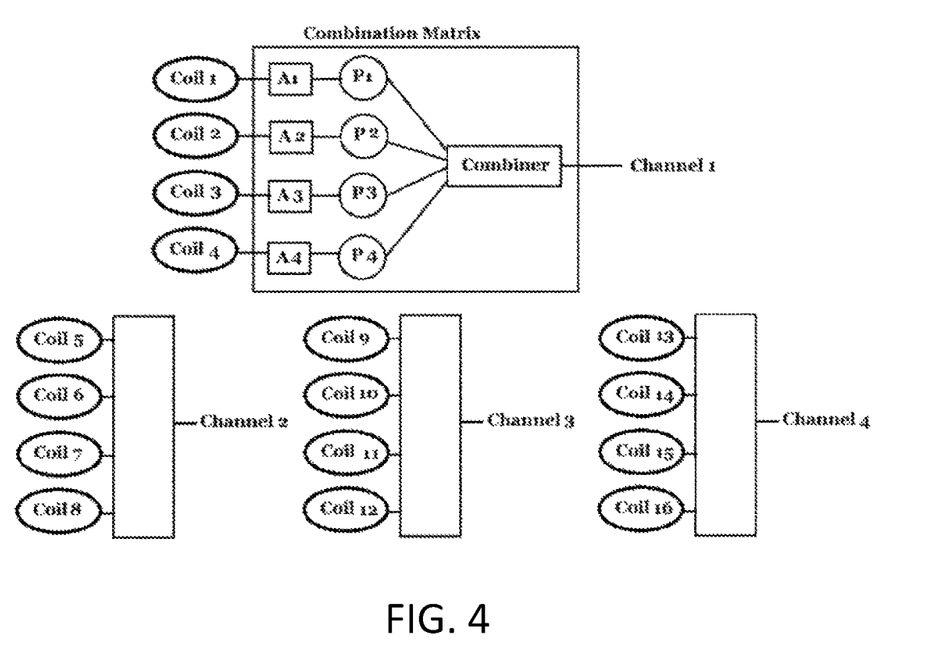
FIG. 4 illustrates a graph illustrating an exemplary pre-combination in accordance with aspects of the present invention.

The pre-combination may be shown as illustrated in FIG. 4.

One simple example for the proposed method may be as follows. For the 16-element coil array, the optimal channel conversion matrix M may be constructed. The first row $M^1=(M^1_1, M^1_2, \ldots, M^1_{16})=m_{1,2}, m_{1,2}, \ldots, m_{1,16})$ may be picked out, which represents the most important virtual channel.

The importance of the coils may be determined and the order is adjusted. It is assumed that the 16 coils $c_1$, $c_2$, $c_{16}$ after the adjustment are ordered by importance. That is, it is assumed that $c_1$ is the most important coil, and $c_{16}$ is the least important coil, and M represents the optimal conversion matrix for the ordered coils.

The 16 ordered coils are then grouped into 4 sub-arrays as ($c_1$, $c_5$, $c_9$, $c_{13}$), ($c_2$, $c_6$, $c_{10}$, $c_{14}$), ($c_3$, $c_7$, $c_{11}$, $c_{15}$), and ($c_4$, $c_8$, $c_{12}$, $c_{16}$) in the following way: $c_1$, $c_2$, $c_3$, $c_4$ are first assigned to sub-arrays 1, 2, 3 and 4, respectively; $c_5$, $c_6$, $c_7$, $c_8$ are then the most important coils of the remaining coils and assigned to sub-arrays 1, 2, 3 and 4, respectively; and the process is repeated until all the coils are assigned into the sub-arrays.

The RF pre-combination matrixes $v^1$, $v^2$, $v^3$ and $v^4$ may be determined for the sub space $W_{result}$ to be as close to the $W_{target}$ as possible.

In brief, for the pre-combination method, a conversion matrix M is constructed first for the coils in the array configured for the same ROI. The conversion matrix M is optimized for the conversion outputs to have highest qualities. The coils are ordered and grouped into sub-arrays based on their importance. The pre-combination coefficients are determined for the sub-space spanned by the pre-combination coefficients to be as close as possible to the space spanned by all rows or the most important rows of the optimized conversion matrix M for the ordered coils. The converter constructed with hardware pre-combiners is simple and cost effective for commercial implementation and is of high performance.

The invention claimed is:

1. A method of channel compression for magnetic resonance imaging (MM), the method comprising:
   pre-combining, using n' pre-combiners, n outputs (C1, C2, ... Cn) from n coils of an n coil array configured for imaging the same region of interest (ROI) to obtain fewer n' pre-combination outputs, where n' is an integer greater than 1, wherein the n coils are grouped into n' sub-arrays based on an order of importance of each of the n coils represented by a contribution of the output of each of the respective n-coils to a signal-to-noise ratio (SNR) of a signal obtained by combining the outputs of the n coils and each pre-combiner is configured to pre-combine outputs from a respective one of the n' sub-arrays to obtain one of the n' pre-combination outputs; and
   compressing the n' pre-combination outputs of the n' pre-combiners into fewer virtual outputs with highest signal-to-noise ratios (SNRs) for image reconstruction.

2. The method of claim 1, wherein the n coils are grouped into the n' sub-arrays by:
   ordering the n coils by the importance from the highest to the lowest;
   assigning a first n' coils of the n coils into the n' sub-arrays, respectively;
   and repeating the assignment of the remaining n-n' coils until all the n coils are assigned.

3. The method of claim 1, wherein the sub-arrays and pre-combination coefficients for the sub-arrays are determined by:
   constructing a channel conversion matrix M of n×n which converts signals $s=(s_1, s_2, s_n)^T$ output from the n coils of the n coil array to conversion outputs $s'=(s_1', s_2', s_n')^T$, $s'=Ms$, wherein $^T$ represents matrix transpose operation;
   selecting rows of the channel conversion matrix M corresponding to a number of conversion outputs with the highest signal-to-noise ratios (SNRs); and
   optimizing the pre-combination coefficients or both the grouping and the pre-combination coefficients such that the pre-combination coefficients span a space which approaches the space spanned by all or the selected rows of M.

4. The method of claim 3, wherein the channel conversion matrix is a whitening matrix.

5. An apparatus of channel compression for Magnetic Resonance Imaging (MRI) comprising a converter, the apparatus further comprising:

n' pre-combiners configured to pre-combine n outputs (C1, C2, . . . Cn) from n coils of an n coil array configured for imaging the same region of interest (ROI) to obtain fewer n' pre-combination outputs, where n' is an integer greater than 1, wherein the n coils are grouped into n' sub-arrays based on an order of importance of each of the n coils represented by a contribution of the output of each of the respective n-coils to a signal-to-noise ratio (SNR) of a signal obtained by combining the outputs of the n coils and each pre-combiner is configured to pre-combine outputs from one of the n' sub-arrays to obtain one of the n' pre-combination outputs,
wherein the converter is coupled to the n' pre-combiners and configured to compress the n' pre-combination outputs into fewer virtual outputs with highest signal-to-noise ratios (SNRs) for image reconstruction.

6. The apparatus of claim 5, wherein the n coils are grouped into n' sub-arrays by:
ordering the n coils by the importance from the highest to the lowest;
assigning a first n' coils of the n coils into the n' sub-arrays, respectively; and
repeating the assignment of the remaining n-n' coils until all the n coils are assigned.

7. The apparatus of claim 5, wherein the n' sub-arrays and pre-combination coefficients for the sub-arrays are determined by:
constructing a channel conversion matrix M of n×n which converts signals $s=(s_1, s_2, s_n)^T$ output from the n' coils of the array to conversion outputs $s'=(s_1', s_2', s_n')^T$, $S'=Ms$, wherein $^T$ represents matrix transpose operation;
selecting rows of the channel conversion matrix M corresponding to a number of conversion outputs with the highest signal-to-noise ratios (SNRs); and
optimizing the pre-combination coefficients or both the grouping and the pre-combination coefficients such that the pre-combination coefficients span a space which approaches the space spanned by all or the selected rows of M.

8. The apparatus of claim 7, wherein the channel conversion matrix is a whitening matrix.

9. The apparatus of claim 5, wherein the converter further comprises:
a plurality of splitters configured to split each of the n' pre-combination outputs to a number of output copies; and
a plurality of combiners coupled to the splitters and configured to combine the the number of output copies to the virtual outputs, wherein each combiner is characterized by a set of complex combination coefficients whose amplitudes represent amplitude weights and angles represent phase shifts.

10. A controller for channel compression for magnetic resonance imaging (MRI), comprising:
a non-transitory computer-readable storage medium that stores machine executable instructions; and
a processor that executes the instructions, wherein, when executed by the processor, the machine executable instructions cause a system that includes the controller to implement a process that comprises:
pre-combining, using n' pre-combiners, n outputs (C1, C2, . . . Cn) from n coils of an n coil array configured for imaging the same region of interest (ROI) to obtain fewer n' pre-combination outputs, where n' is an integer greater than 1, wherein the n coils are grouped into n' sub-arrays based on an order of importance of each of the n coils represented by a contribution of the output of each of the respective n-coils to a signal-to-noise ratio (SNR) of a signal obtained by combining the outputs of the n coils and each pre-combiner is configured to pre-combine outputs from a respective one of the n' sub-arrays to obtain one of the n' pre-combination outputs; and
compressing the n' pre-combination outputs of the n' pre-combiners into fewer virtual outputs with highest signal-to-noise ratios (SNRs) for image reconstruction.

11. The controller of claim 10, wherein the process implemented by the system further comprises:
grouping the n coils into the n' sub-arrays by:
ordering the n coils by the importance from the highest to the lowest;
assigning a first n' coils of the n coils into the n' sub-arrays, respectively; and
repeating the assignment of the remaining n-n' coils until all the n coils are assigned.

12. The controller of claim 10, wherein the process implemented by the system further comprises:
determining the sub-arrays and pre-combination coefficients for the n' sub-arrays by:
constructing a channel conversion matrix M of n×n which converts signals $s=(s_1, s_2, \ldots, s_n)^T$ output from the n coils of the array to conversion outputs $s'=(s_1', s_2', \ldots, s_n')^T$ $s'=Ms$, wherein $^T$ represents matrix transpose operation;
selecting rows of the channel conversion matrix M corresponding to a number of conversion outputs with the highest signal-to-noise ratios (SNRs); and
optimizing the pre-combination coefficients or both the grouping and the pre-combination coefficients such that the pre-combination coefficients span a space which approaches the space spanned by all or the selected rows of M.

13. The controller of claim 12, wherein the channel conversion matrix is a whitening matrix.

\* \* \* \* \*